US009536787B2

United States Patent
Ogawa et al.

(10) Patent No.: US 9,536,787 B2
(45) Date of Patent: Jan. 3, 2017

(54) WAFER PROCESSING METHOD

(71) Applicant: DISCO CORPORATION, Tokyo (JP)

(72) Inventors: Yuki Ogawa, Tokyo (JP); Kensuke Nagaoka, Tokyo (JP); Tsubasa Obata, Tokyo (JP); Yuri Ban, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/135,172

(22) Filed: Apr. 21, 2016

(65) Prior Publication Data
US 2016/0315011 A1  Oct. 27, 2016

(30) Foreign Application Priority Data

Apr. 21, 2015 (JP) ................................. 2015-086837

(51) Int. Cl.
*H01L 21/78* (2006.01)
*H01L 21/683* (2006.01)
*H01L 23/544* (2006.01)
*H01L 21/66* (2006.01)

(52) U.S. Cl.
CPC ......... *H01L 21/78* (2013.01); *H01L 21/6836* (2013.01); *H01L 22/26* (2013.01); *H01L 23/544* (2013.01); *H01L 2221/6834* (2013.01); *H01L 2221/68327* (2013.01); *H01L 2223/5446* (2013.01)

(58) Field of Classification Search
CPC .................................. H01L 22/12; H01L 21/78
See application file for complete search history.

(56) References Cited

U.S. PATENT DOCUMENTS

| 9,293,372 B2* | 3/2016 | Nagaoka ............. H01L 21/6835 |
| 2003/0013380 A1* | 1/2003 | Arai ........................ B24B 7/228 451/6 |
| 2005/0260829 A1* | 11/2005 | Uematsu ............. H01L 21/3043 438/460 |
| 2014/0073067 A1* | 3/2014 | Uchida ................... H01L 21/78 438/5 |

(Continued)

FOREIGN PATENT DOCUMENTS

JP           2005-064231          3/2005

*Primary Examiner* — Charles Garber
*Assistant Examiner* — Ali Sabur
(74) *Attorney, Agent, or Firm* — Greer Burns & Crain, Ltd.

(57) ABSTRACT

Disclosed herein is a wafer processing method for dividing a wafer into a plurality of individual devices along a plurality of crossing division lines. The wafer is composed of a substrate and a functional layer formed on the front side of the substrate. The division lines are formed on the front side of the functional layer. A laser beam having a transmission wavelength is applied to the wafer from the back side thereof to detect the height of an interface between the functional layer and the substrate in an area corresponding to each division line. The depth of cut by a cutting blade for cutting the substrate is next set according to the height detected above. The back side of the substrate is next cut by the cutting blade according to the depth of cut set above to thereby form a cut groove having a depth not reaching the functional layer with a remaining part of the substrate left between the bottom of the cut groove and the functional layer along each division line, the remaining part having a uniform thickness. Thereafter, the remaining part and the functional layer are cut along each division line to thereby divide the wafer.

3 Claims, 18 Drawing Sheets

(56) References Cited

U.S. PATENT DOCUMENTS

2014/0206177 A1* 7/2014 Ogawa .................... H01L 21/78
  438/462
2016/0111331 A1* 4/2016 Ogawa .................... H01L 21/78
  438/113

* cited by examiner

| X coordinate | Height (μm) | Z coordinate ((H1+h)μm) |
|---|---|---|
| X1 | H1 | Z1 |
| X2 | H1 | Z2 |
| X3 | H1 | Z3 |
| X4 | H1 | Z4 |
| . | . | . |
| . | . | . |
| . | . | . |
| Xn-1 | H1 | Zn-1 |
| Xn | H1 | Zn |
| Xn | H1 | Zn |

WAFER PROCESSING METHOD

BACKGROUND OF THE INVENTION

Field of the Invention

The present invention relates to a wafer processing method.

Description of the Related Art

There has been put into practical use a manufacturing method for a semiconductor wafer having a plurality of semiconductor devices such as ICs and LSIs, wherein the semiconductor wafer is intended to improve the processing performance of the semiconductor devices. This semiconductor wafer is composed of a substrate and a functional layer formed on the front side of the substrate, wherein the functional layer is formed by stacking a plurality of low-permittivity insulator films (low-k films). Examples of each low-k film include an inorganic film of SiOF, BSG (SiOB), etc. and an organic film such as a polymer film of polyimide, parylene, etc. The semiconductor devices are formed from the functional layer of the wafer. The functional layer is brittle so that it is easily separated from the substrate in cutting the wafer by using a cutting blade. To cope with this problem, there has been performed a wafer processing method including the steps of applying a laser beam along both sides of each division line on a semiconductor wafer to form two laser processed grooves dividing the functional layer along each division line, and next positioning a cutting blade between the two laser processed grooves along each division line to relatively move the cutting blade and the semiconductor wafer, thereby cutting the wafer along each division line (see Japanese Patent Laid-open No. 2005-64231, for example).

SUMMARY OF THE INVENTION

However, when the division of the functional layer in forming the laser processed grooves is insufficient, the cutting blade may be deviated or tilted. As a result, the functional layer cannot be uniformly cut by the cutting blade and the wafer cannot be divided accurately.

It is therefore an object of the present invention to provide a wafer processing method which can accurately divide a wafer having a functional layer.

In accordance with an aspect of the present invention, there is provided a wafer processing method for dividing a wafer into a plurality of individual devices along a plurality of crossing division lines, the wafer being composed of a substrate and a functional layer formed on the front side of the substrate, the division lines being formed on the front side of the functional layer to thereby define a plurality of separate regions where the devices are respectively formed, the wafer processing method including a protective member attaching step of attaching a protective member to the front side of the functional layer of the wafer; a height recording step of holding the wafer on a chuck table in the condition where the protective member is in contact with the chuck table after performing the protective member attaching step, applying a laser beam having a transmission wavelength to the substrate from the back side of the wafer held on the chuck table to detect the height of an interface between the functional layer and the substrate in a Z direction in an area corresponding to each division line as relatively moving the chuck table and the laser beam in an X direction, and recording an X coordinate on each division line and a Z coordinate corresponding to the X coordinate and the height detected; a cut groove forming step of positioning a cutting blade on the back side of the substrate of the wafer in the area corresponding to each division line after performing the height recording step and next relatively moving the chuck table and the cutting blade in the X direction to thereby form a cut groove having a depth not reaching the functional layer with a remaining part of the substrate left between the bottom of the cut groove and the functional layer; and a dividing step of dividing the remaining part and the functional layer along the cut groove extending along each division line after performing the cut groove forming step; the cut groove forming step including the step of moving the cutting blade in the Z direction according to the X coordinate and the Z coordinate recorded in the height recording step to thereby make the thickness of the remaining part uniform in the X direction.

Preferably, the height recording step is performed at the same X coordinate as the X coordinate where the cutting blade is to be positioned in the cut groove forming step. Preferably, height measuring means is used in the height recording step to measure the height of the interface between the functional layer and the substrate by using reflected light obtained by the reflection of the laser beam from the interface.

According to the wafer processing method of the present invention, the laser beam having a transmission wavelength to the substrate is applied to the wafer from the back side thereof to detect the height of the interface between the functional layer and the substrate in the area corresponding to each division line. The depth of cut by the cutting blade is next set according to the height detected above. The back side of the substrate is next cut by using the cutting blade according to the depth of cut set above to thereby form a cut groove having a depth not reaching the functional layer with a remaining part of the substrate left between the bottom of the cut groove and the functional layer along each division line, the remaining part having a uniform thickness. Thereafter, the remaining part and the functional layer are cut along each division line to thereby divide the wafer. Accordingly, the functional layer can be uniformly cut and the wafer can therefore be divided accurately.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will now be described in detail with reference to the drawings. The present invention is not limited to these preferred embodiments. Further, the components used in these preferred embodiments may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
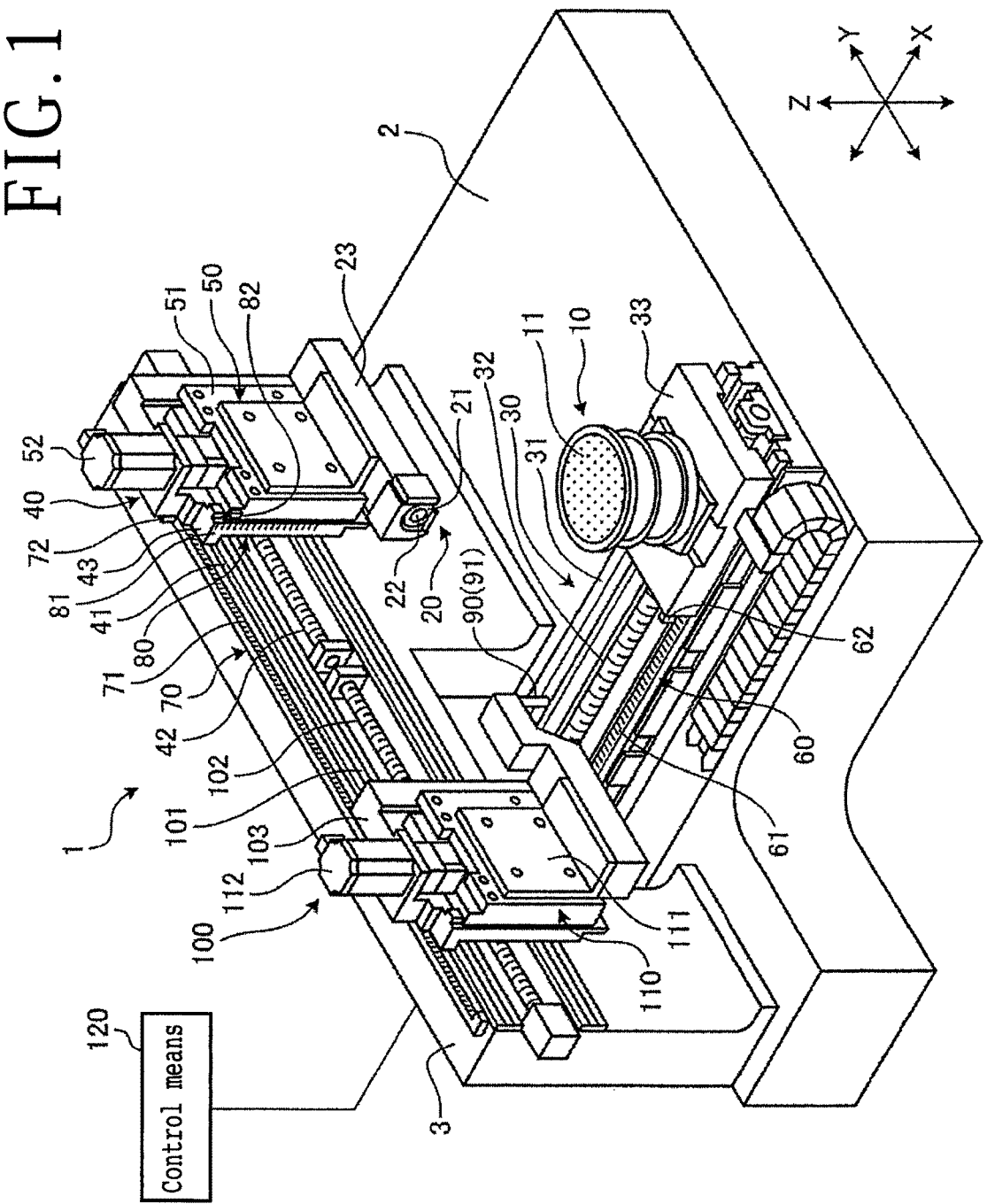
FIG. 1 is a perspective view showing the configuration of a cutting apparatus for performing a wafer processing method according to a first preferred embodiment of the present invention.
Figure 2:
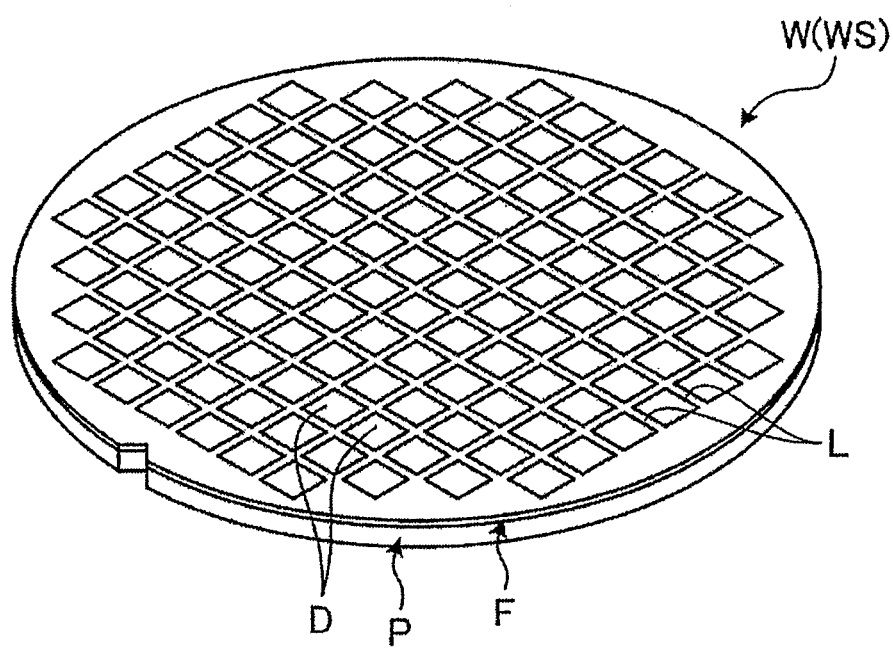
FIG. 2 is a perspective view showing the configuration of a wafer to be processed by the cutting apparatus shown in FIG. 1.
Figure 3:
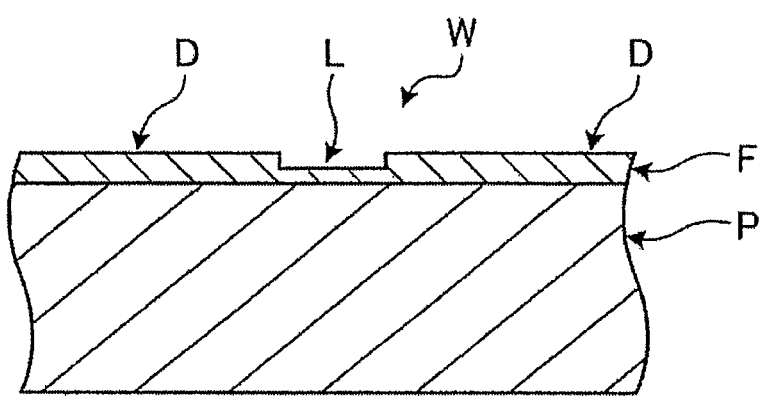
FIG. 3 is a sectional view of the wafer shown in FIG. 2.

A first preferred embodiment of the wafer processing method according to the present invention will now be described. FIG. 1 is a perspective view showing the configuration of a cutting apparatus 1 for performing the first preferred embodiment. FIG. 2 is a perspective view showing the configuration of a wafer W to be processed by the cutting apparatus 1. FIG. 3 is a sectional view of the wafer W shown in FIG. 2. The cutting apparatus 1 is designed to cut the wafer W. As shown in FIG. 1, the cutting apparatus 1 includes a chuck table 10, cutting means 20, work feeding means (X moving means) 30, indexing means (first Y moving means) 40, cutter feeding means (first Z moving means) 50, X position detecting means 60, Y position detecting means 70, and Z position detecting means 80.

The wafer W includes various kinds of wafers such as a semiconductor wafer and an optical device wafer. The semiconductor wafer is composed of a substrate formed of silicon, gallium arsenide, etc. and a functional layer formed on the substrate, wherein semiconductor devices are formed in the functional layer. Similarly, the optical device wafer is composed of a substrate formed of sapphire, SiC, etc. and a functional layer formed on the substrate, wherein optical devices are formed in the functional layer. More specifically, as shown in FIGS. 2 and 3, the wafer W is composed of a substrate P and a functional layer F formed on the front side (upper surface) of the substrate P. The functional layer F is formed by stacking a plurality of low-permittivity insulator films (low-k films). Examples of each low-k film include an inorganic film of SiOF, BSG (SiOB), etc. and an organic film such as a polymer film of polyimide, parylene, etc. Further, a passivation film of $SiO_2$, SiN, etc. is formed on the front side of the functional layer F. A plurality of crossing division lines L are formed on the front side (upper surface) of the functional layer F to thereby define a plurality of separate regions where a plurality of devices D are respectively formed.

In this description, the X direction shown by an arrow X in FIG. 1 means a direction of feeding the wafer W held on the chuck table 10. The Y direction shown by an arrow Y in FIG. 1 is perpendicular to the X direction in the same horizontal plane and means a direction of indexing the cutting means 20 with respect to the wafer W held on the chuck table 10. The Z direction shown by an arrow Z in FIG. 1 is a vertical direction perpendicular to the X direction and the Y direction.

The chuck table 10 is provided on the upper surface of a fixed base 2 so as to be movable in the X direction. The chuck table 10 has a circular holding surface 11. The chuck table 10 is rotatable about its axis perpendicular to the holding surface 11 by any rotating means (not shown). The holding surface 11 is an upper end surface of the chuck table 10 and this surface is horizontally flat. The holding surface 11 is formed of porous ceramic, for example, and it is adapted to hold the wafer W under suction by a vacuum generated from a vacuum source (not shown).

The cutting means 20 functions to cut the wafer W held on the chuck table 10. The cutting means 20 is mounted through the first Y moving means 40 and the first Z moving means 50 to a double column type support frame 3. The double column type support frame 3 is provided on the fixed base 2 so as to extend in the Y direction and straddle a moving path of the chuck table 10. The cutting means 20 includes a cutting blade 21, a spindle 22, and a housing 23. The cutting blade 21 is a very thin, annular abrasive member for cutting the wafer W. The cutting blade 21 is detachably mounted on the front end of the spindle 22. The spindle 22 is rotatably supported in the housing 23. The spindle 22 is rotated about its axis extending in the Y direction by a drive source (not shown) such as a motor provided in the housing 23. By rotating the spindle 22 at high speeds, the cutting blade 21 is rotated to cut the wafer W.

The X moving means 30 functions to relatively move the chuck table 10 and the cutting means 20 in the X direction. The X moving means 30 includes a pair of guide rails 31 extending in the X direction, a ball screw 32 extending parallel to the guide rails 31, a nut (not shown) threadedly engaged with the ball screw 32, an X moving block 33 fixed to this nut and slidably provided on the guide rails 31, and a pulse motor (not shown) for rotating the ball screw 32. Accordingly, when the ball screw 32 is rotated by the pulse motor, the X moving block 33 supporting the chuck table 10 is moved in the X direction.

The first Y moving means 40 functions to relatively move the chuck table 10 and the cutting means 20 in the Y direction. The first Y moving means 40 includes a pair of guide rails 41 extending in the Y direction, a ball screw 42 extending parallel to the guide rails 41, a nut (not shown) threadedly engaged with the ball screw 42, a Y moving block 43 fixed to this nut and slidably provided on the guide rails 41, and a pulse motor (not shown) for rotating the ball screw 42. Accordingly, when the ball screw 42 is rotated by the pulse motor, the Y moving block 43 supporting the first Z moving means 50 is moved in the Y direction.

The first Z moving means 50 functions to move the cutting means 20 in the Z direction perpendicular to the holding surface 11 of the chuck table 10. The first Z moving means 50 includes a pair of guide rails (not shown) fixed to the Y moving block 43 and extending in the Z direction, a ball screw (not shown) extending parallel to these guide rails, a nut (not shown) threadedly engaged with this ball screw, a Z moving block 51 fixed to this nut and slidably provided on these guide rails, and a pulse motor 52 for rotating this ball screw. Accordingly, when the ball screw is rotated by the pulse motor 52, the Z moving block 51 supporting the cutting means 20 is moved in the Z direction.

The X position detecting means 60 functions to detect the X position of the chuck table 10. The X position detecting means 60 includes a linear scale 61 extending in the X direction along one of the guide rails 31 and a read head 62 provided on the X moving block 33 and movable along the linear scale 61 together with the X moving block 33. The read head 62 is designed to optically read the marks of the linear scale 61 and output a pulse signal of one pulse every 1 μm, for example.

The Y position detecting means 70 functions to detect the Y position of the cutting means 20. The Y position detecting means 70 includes a linear scale 71 extending in the Y direction along one of the guide rails 41 on the double column type support frame 3 and a read head 72 provided on the Y moving block 43 and movable along the linear scale 71 together with the Y moving block 43. The read head 72 is designed to optically read the marks of the linear scale 71 and output a pulse signal of one pulse every 1 μm, for example.

The Z position detecting means 80 functions to detect the Z position of the cutting means 20. The Z position detecting means 80 includes a linear scale 81 extending in the Z direction along one of the guide rails on the Y moving block 43 and a read head 82 provided on the Z moving block 51 and movable along the linear scale 81 together with the Z moving block 51. The read head 82 is designed to optically read the marks of the linear scale 81 and output a pulse signal of one pulse every 1 μm, for example.

The cutting apparatus 1 further includes measuring means 90, second Y moving means 100, second Z moving means 110, and control means 120. The measuring means 90 functions to detect the height (vertical position) of an interface B (see FIG. 7) between the functional layer F and the substrate P of the wafer W. The measuring means 90 is mounted through the second Y moving means 100 and the second Z moving means 110 to the double column type support frame 3. The measuring means 90 includes height measuring means 91 for measuring the height of the interface B between the functional layer F and the substrate P by using reflected light from the interface B. For example, the height measuring means 91 is designed to detect the height of the interface B between the functional layer F and the substrate P by using a known method such as spectral interference method and confocal method.

The second Y moving means 100 functions to relatively move the measuring means 90 and the chuck table 10 in the Y direction. The second Y moving means 100 includes a pair of guide rails 101 extending in the Y direction, a ball screw 102 extending parallel to the guide rails 101, a nut (not shown) threadedly engaged with the ball screw 102, a Y moving block 103 fixed to this nut and slidably provided on the guide rails 101, and a pulse motor (not shown) for rotating the ball screw 102. Accordingly, when the ball screw 102 is rotated by the pulse motor, the Y moving block 103 supporting the measuring means 90 is moved in the Y direction.

The second Z moving means 110 functions to move the measuring means 90 in the Z direction perpendicular to the holding surface 11 of the chuck table 10. The second Z moving means 110 includes a pair of guide rails (not shown) fixed to the Y moving block 103 and extending in the Z direction, a ball screw (not shown) extending parallel to these guide rails, a nut (not shown) threadedly engaged with this ball screw, a Z moving block 111 fixed to this nut and slidably provided on these guide rails, and a pulse motor 112 for rotating this ball screw. Accordingly, when the ball screw is rotated by the pulse motor 112, the Z moving block 111 supporting the measuring means 90 is moved in the Z direction.

The control means 120 functions to control each component of the cutting apparatus 1. For example, the control means 120 is connected to drive circuits (not shown) for driving the pulse motors of the X moving means 30, the first Y moving means 40, and the first Z moving means 50. Then, the control means 120 controls the drive circuits to decide the X position of the chuck table 10, the Y position of the cutting means 20, and the Z position of the cutting means 20. Further, the control means 120 is connected to drive circuits (not shown) for driving the pulse motors of the second Y moving means 100 and the second Z moving means 110. Then, the control means 120 controls the drive circuits to decide the Y position of the measuring means 90 and the Z position of the measuring means 90.

Figure 5:
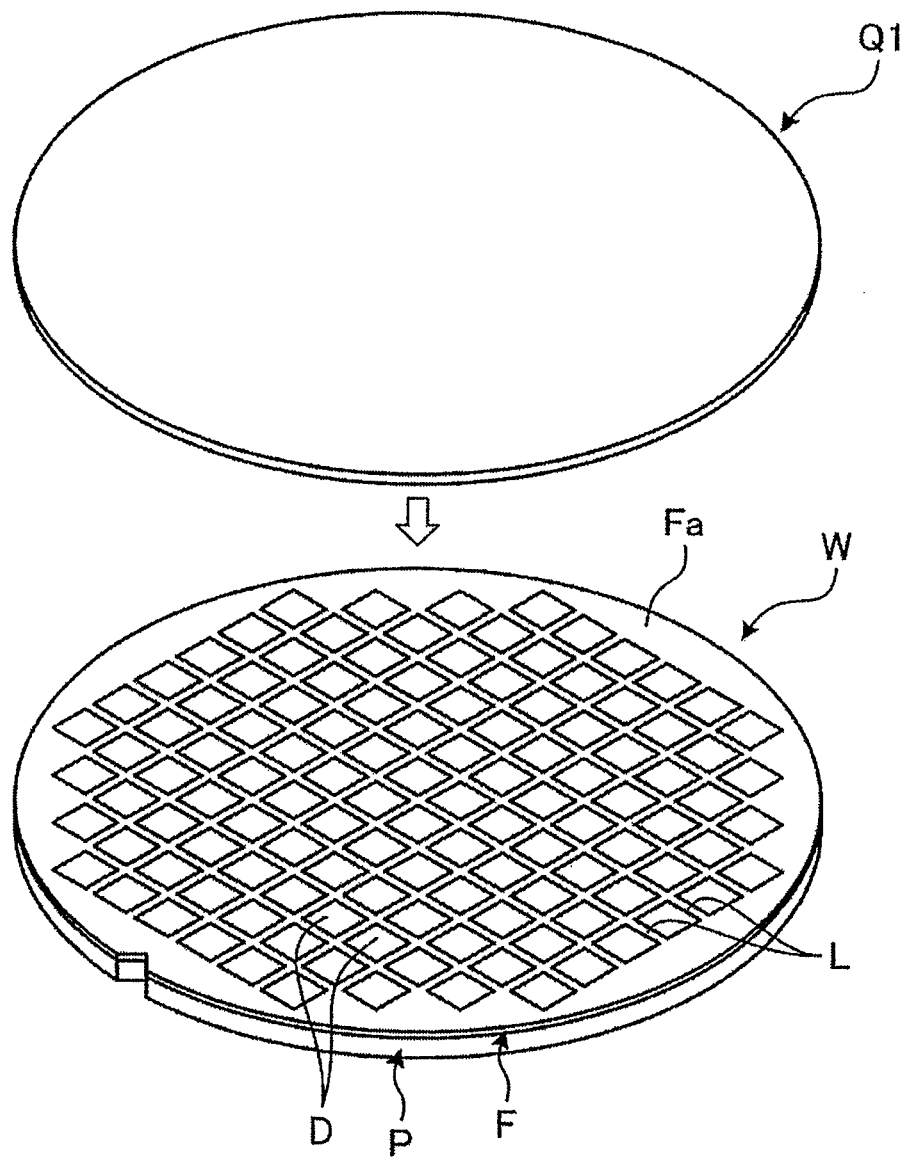
FIGS. 5 and 6 are perspective views showing a protective member attaching step according to the first preferred embodiment.
Figure 6:
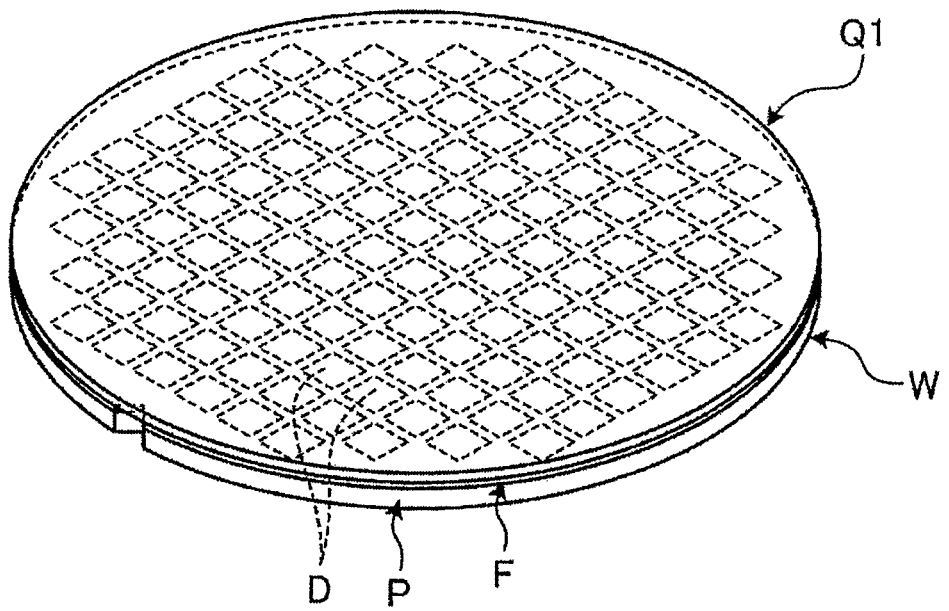

The wafer processing method according to the first preferred embodiment will now be described. The wafer processing method according to the first preferred embodiment includes a protective member attaching step, height recording step, cut groove forming step, and dividing step. In the protective member attaching step, a protective member Q1 is attached to the front side Fa of the functional layer F of the wafer W as shown in FIGS. 5 and 6 (step S1 shown in FIG. 4). For example, the protective member Q1 is a resin sheet such as polyethylene film or a hard plate having rigidity such as glass substrate. The protective member Q1 has substantially the same size as that of the wafer W.

Figure 4:
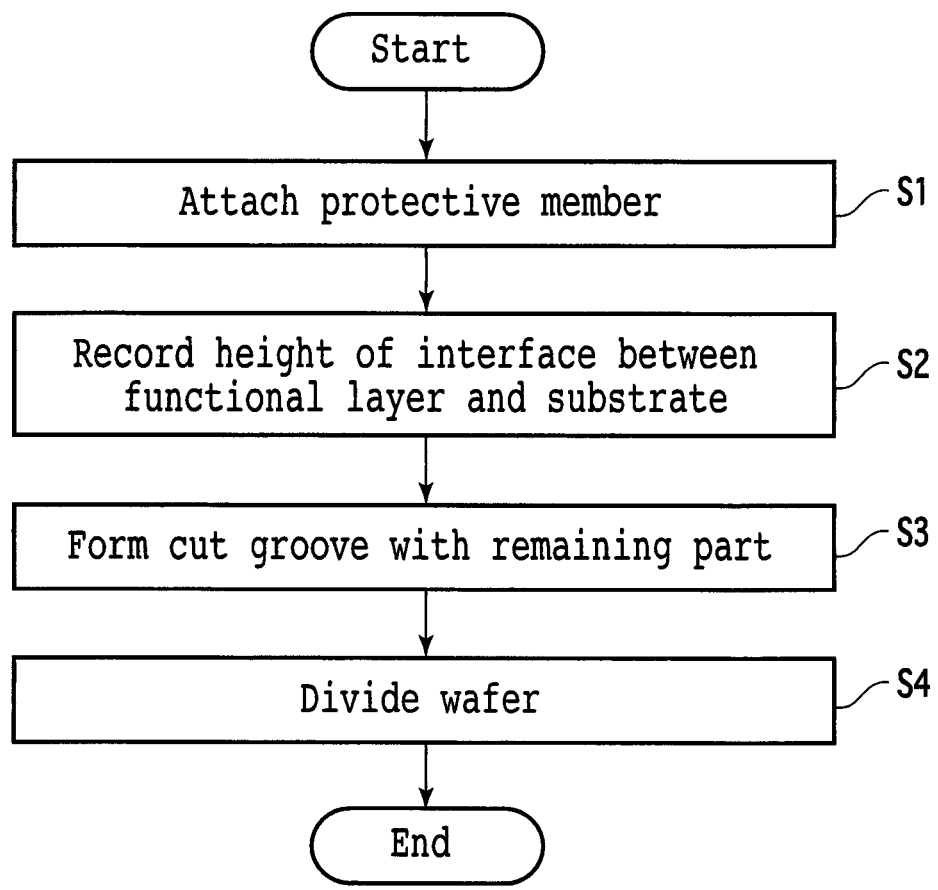
FIG. 4 is a flowchart showing the wafer processing method according to the first preferred embodiment.

In the height recording step, the control means 120 records the height of the interface B between the functional layer F and the substrate P (step S2 shown in FIG. 4). More specifically, the control means 120 controls transfer means (not shown) holding the wafer W to place the wafer W on the chuck table 10 at a predetermined position in the condition where the protective member Q1 is in contact with the holding surface 11 of the chuck table 10. Thereafter, the control means 120 operates the vacuum source to hold the wafer W on the chuck table 10 under suction and then performs an alignment operation. Thereafter, the control means 120 moves the height measuring means 91 in the Y direction and the Z direction and also moves the chuck table 10 in the X direction to position the height measuring means 91 directly above a predetermined one of the division lines L of the wafer W. For example, the control means 120 moves the height measuring means 91 to a measurement start position on the division line L formed at one end in the Y direction.

Figure 7:
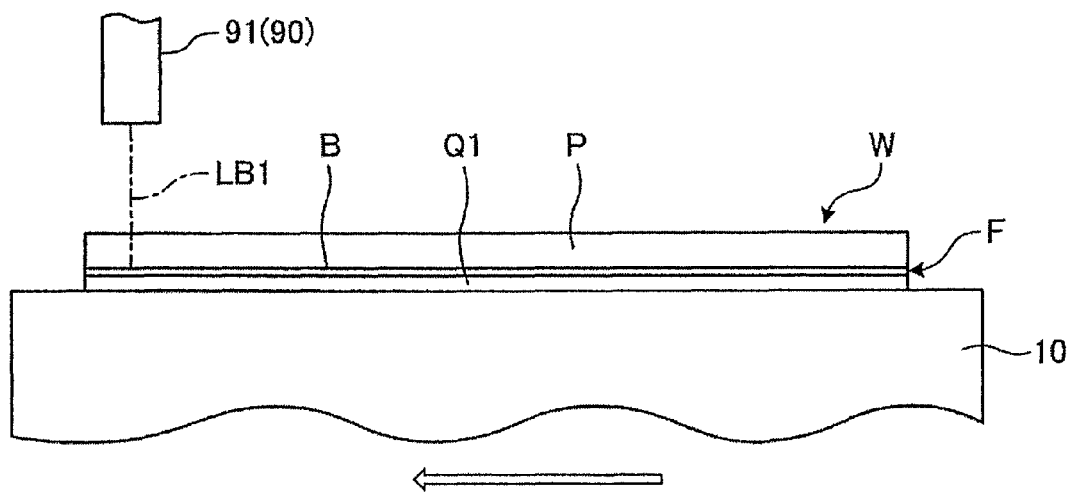
FIGS. 7 to 9 are sectional views showing a height recording step according to the first preferred embodiment.
Figure 8:
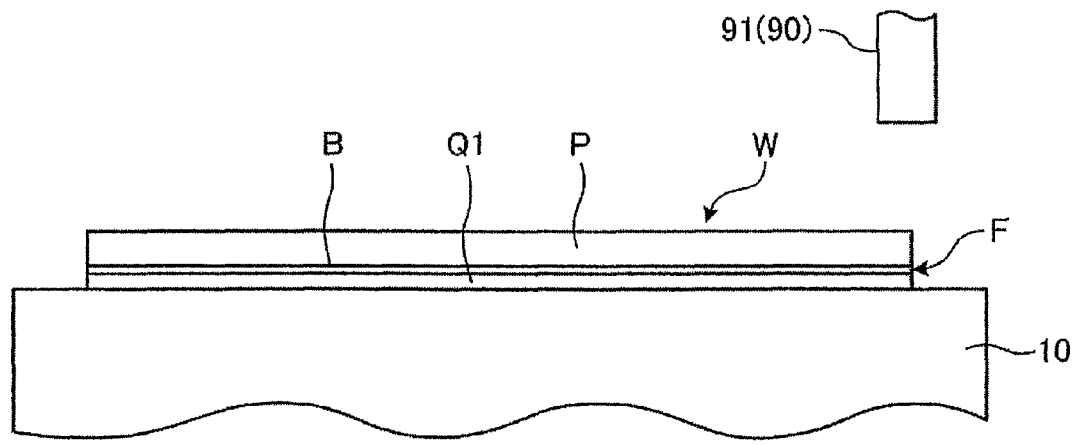
Figures 9, 10:
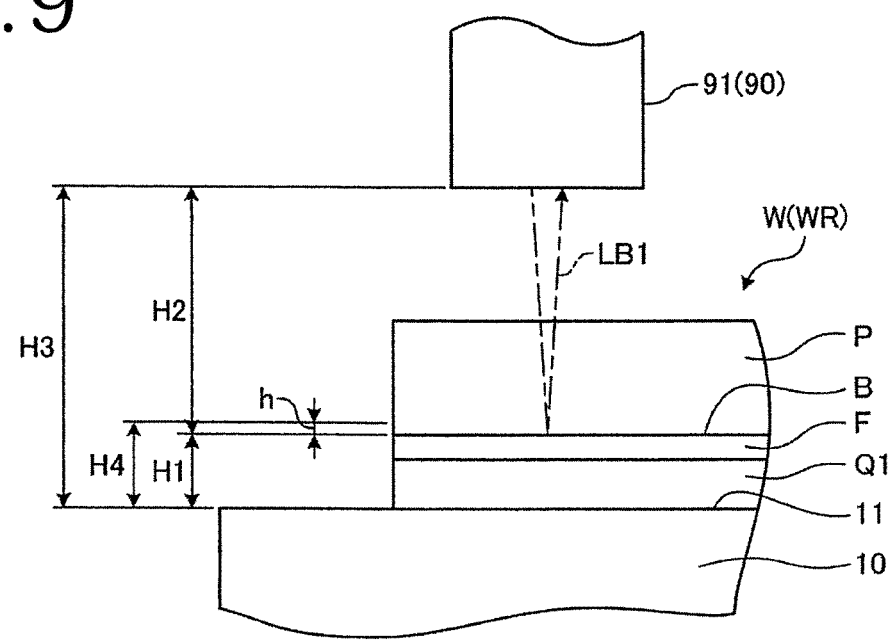
FIG. 10 is a table showing data on the height of an interface between a functional layer and a substrate constituting the wafer as used in the height recording step.

Thereafter, as shown in FIGS. 7 and 8, the control means 120 operates the height measuring means 91 to apply a laser beam LB1 having a transmission wavelength to the substrate P from the height measuring means 91 toward the interface B between the functional layer F and the substrate P. Further, the control means 120 moves the chuck table 10 in the X direction to thereby relatively move the height measuring means 91 from a measurement start position to a measurement end position on the predetermined division line L of the wafer W as shown in FIGS. 7 and 8. At this time, the height measuring means 91 detects the height H1 of the interface B between the functional layer F and the substrate P in the area corresponding to the predetermined division line L, from the back side WR of the wafer W held on the chuck table 10 as shown in FIG. 9. More specifically, the height measuring means 91 first determines the distance H2 from the height measuring means 91 to the interface B between the functional layer F and the substrate P according to the light (laser beam LB1) reflected from the interface B. Thereafter, the height measuring means 91 subtracts the distance H2 from the distance H3 as a preset distance from the holding surface 11 of the chuck table 10 to the height measuring means 91, thereby obtaining the height H1 (=H3−H2) as the distance from the holding surface 11 of the chuck table 10 to the interface B. Then, the height measuring means 91 outputs the height H1 detected above to the control means 120.

As shown in FIG. 10, the control means 120 determines a height H4 (=H1+h) obtained by adding a thickness h to the height H1, wherein the thickness h corresponds to the thickness of a remaining part (remaining layer) Pa of the substrate P left between the bottom of a cut groove Pd and the functional layer F (see FIG. 14) to be hereinafter described. Further, the control means 120 prepares a table T showing the correspondence among the height H1 of the interface B, the X coordinate of the predetermined division line L, and the Z coordinate of the height H4 determined above. This table T is recorded into a recording portion (not shown). The control means 120 similarly prepares a plurality of tables T for all of the other division lines L and records these tables T into the recording portion. The X coordinate of each division line L to be recorded is the same as the X coordinate where the cutting blade 21 is to be positioned in the cut groove forming step to be hereinafter described. Further, the Z coordinate of the height H4 to be recorded is the same as the Z coordinate of the vertical position of the lower end of the cutting blade 21. Further, the thickness h may be suitably changed by setting a suitable value for the thickness h from an operator to the cutting apparatus 1.

Figure 11:
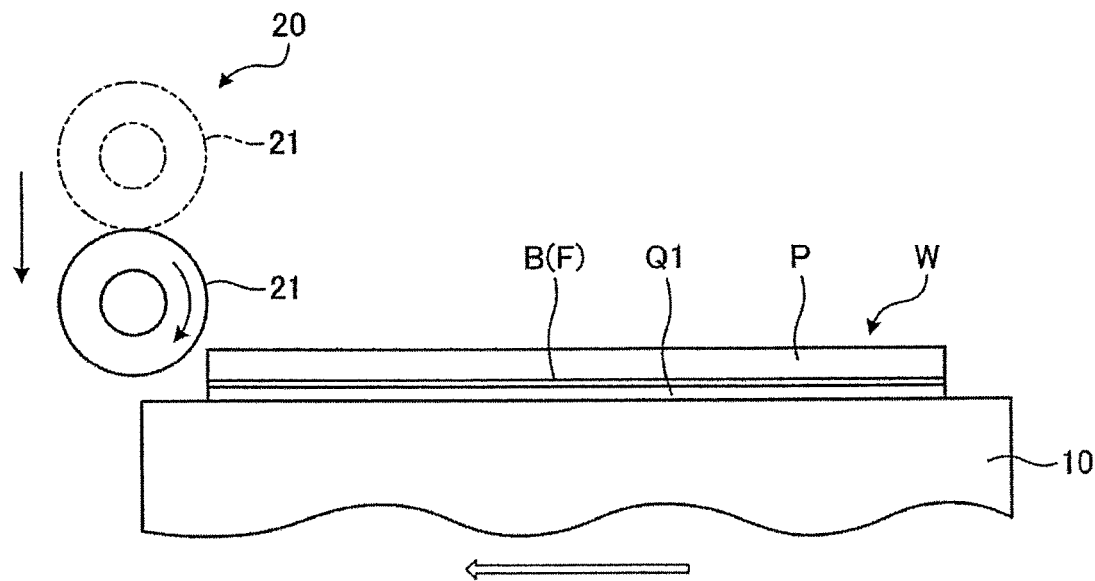
FIGS. 11 to 14 are sectional views showing a cut groove forming step according to the first preferred embodiment.
Figure 12:
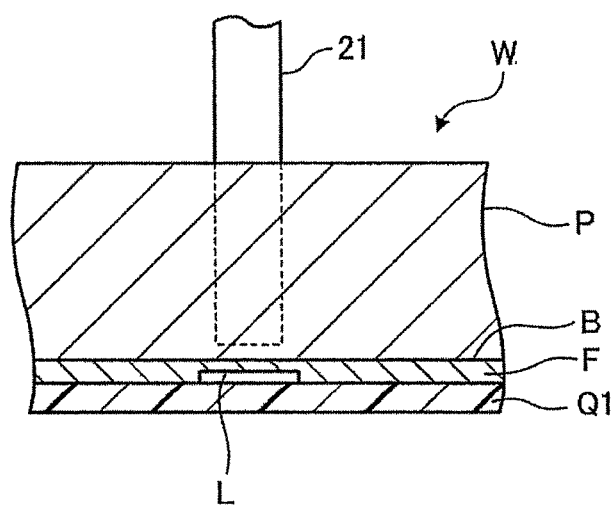
Figure 13:
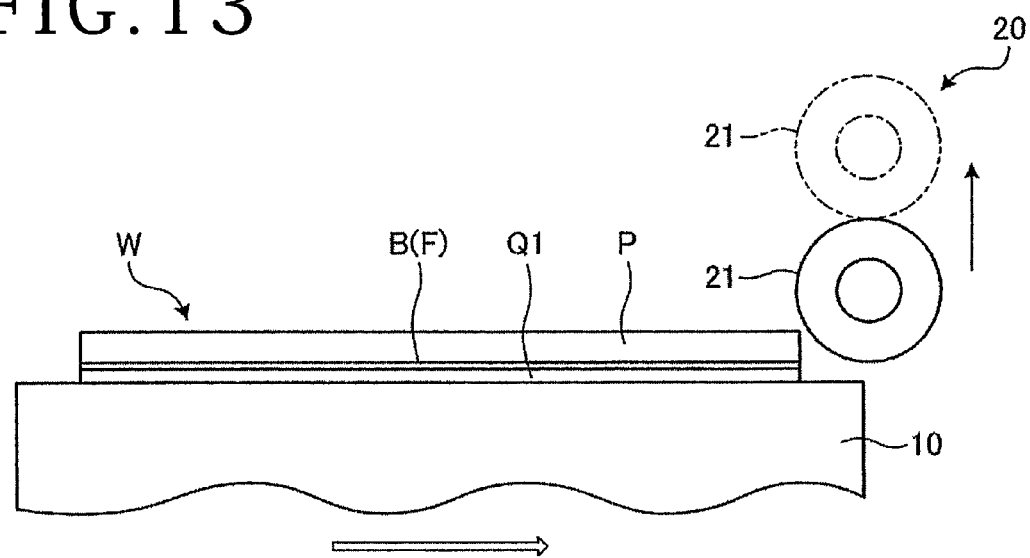
Figure 14:
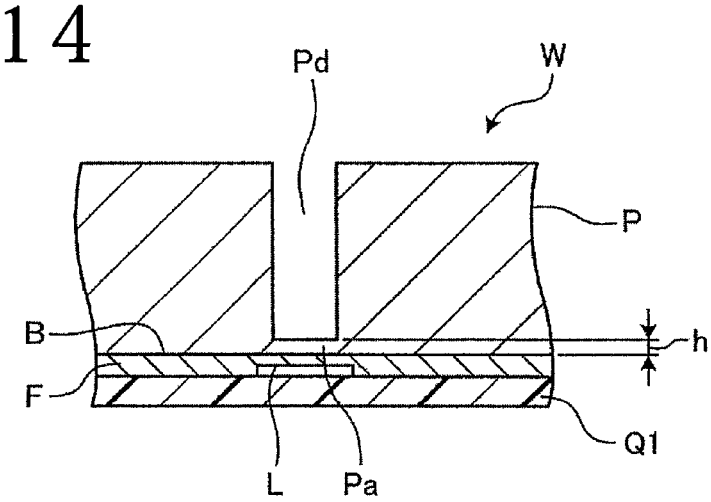

In the cut groove forming step, the control means 120 controls the cutting means 20 to form the cut groove Pd having a depth not reaching the functional layer F with a remaining part Pa of the substrate P left between the bottom of the cut groove Pd and the functional layer F (step S3 shown in FIG. 4). More specifically, the control means 120 first retracts the measuring means 90 from the chuck table 10 and then moves the cutting blade 21 to a start position where the back side of the substrate P in the area corresponding to the predetermined division line L starts to be cut by the cutting blade 21 as shown in FIGS. 11 and 12. Thereafter, the control means 120 refers to the recording portion and reads out the table T corresponding to the predetermined division line L. As shown in FIGS. 13 and 14, the control means 120 next moves the wafer W held on the chuck table 10 in the X direction (i.e., moves the chuck table 10 holding the wafer W in the X direction) and also moves the cutting blade 21 in the Z direction according to the data on the X coordinate and the Z coordinate shown in the table T read above, thereby forming the cut groove Pd having a depth not reaching the functional layer F with the remaining part Pa having the uniform thickness h left between the bottom of the cut groove Pd and the functional layer F. At this time, the control means 120 obtains data on the X coordinate of the chuck table 10, i.e., the X coordinate on the predetermined division line L of the wafer W held on the chuck table 10, according to the pulse signal output from the read head 62 of the X position detecting means 60. Further, the control means 120 obtains data on the Z coordinate of the cutting blade 21 according to the pulse signal output from the read head 82 of the Z position detecting means 80. The control means 120 similarly performs this cutting step along all of the other division lines L to form a similar cut groove Pd along each division line L.

Figure 15:
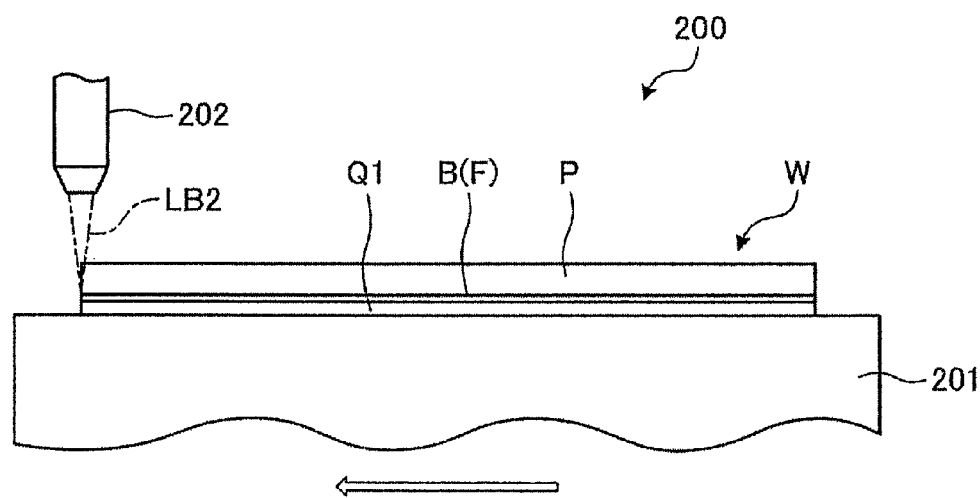
FIGS. 15 to 18 are sectional views showing a dividing step of dividing the wafer by ablation according to the first preferred embodiment.
Figure 16:
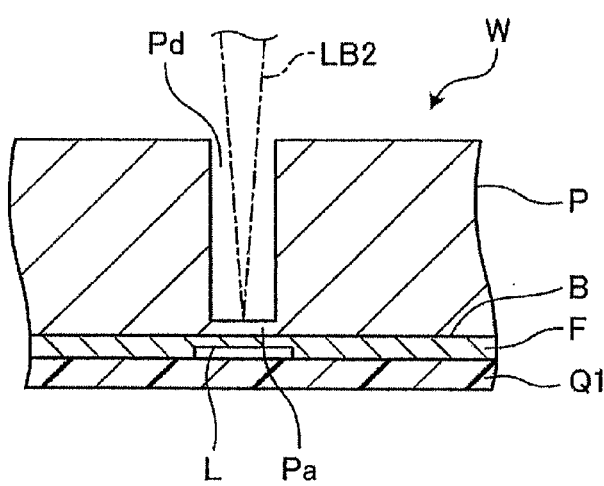
Figure 17:
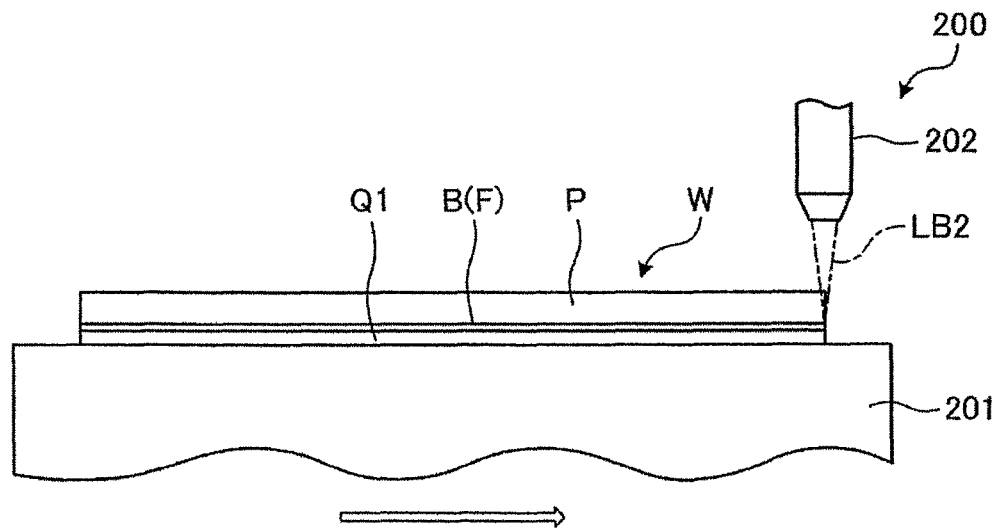
Figure 18:
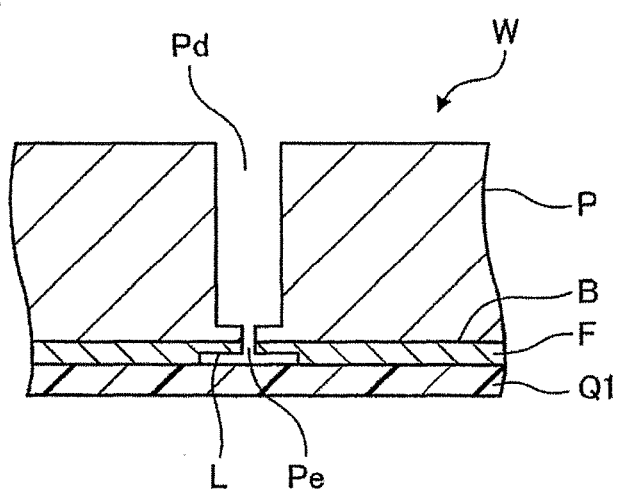

The dividing step is next performed by using a laser processing apparatus 200 as shown in FIGS. 15 to 18. That is, the laser processing apparatus 200 is used to divide the wafer W along each division line L where the cut groove Pd has been formed in the substrate P with the remaining part Pa left between the bottom of the cut groove Pd and the functional layer F (step S4 shown in FIG. 4). More specifically, the laser processing apparatus 200 includes a chuck table 201 and laser beam applying means 202 as shown in FIG. 15. The wafer W is held on the chuck table 201 under suction in the condition where the back side WR of the wafer W is oriented upward. In this condition, the laser beam applying means 202 is operated to apply a laser beam LB2 to the remaining part Pa of the wafer W from the back side WR thereof along the predetermined division line L, thereby forming a division groove Pe dividing the remaining part Pa and the functional layer F along the predetermined division line L as shown in FIG. 18 (ablation processing). For example, this ablation processing is performed in such a manner that the laser beam LB2 having an absorption wavelength to the substrate P and the functional layer F is used and the focal point of the laser beam LB2 is set near the upper surface of the remaining part Pa, i.e., near the bottom of the cut groove Pd formed along the predetermined division line L. This dividing step is similarly performed along all of the other division lines L to apply the laser beam LB2 to the remaining part Pa along each division line L, thereby forming a similar division groove Pe dividing the remaining part Pa and the functional layer F along each division line L.

In the wafer processing method according to the first preferred embodiment described above, the laser beam LB1 having a transmission wavelength to the substrate P is applied to the wafer W from the back side WR thereof to detect the height H1 of the interface B between the functional layer F and the substrate P in the area corresponding to each division line L. Then, the depth of cut in the substrate P by the cutting blade 21 is set according to the height H1 detected above to form the cut groove Pd on the back side of the substrate P with the remaining part Pa left between the bottom of the cut groove Pd and the functional layer F along each division line L. Accordingly, the remaining part Pa having a uniform thickness h can be always formed according to the height H1 of the interface B between the functional layer F and the substrate P without being affected by variations in thickness of the wafer W or the protective member Q1. Thusly, the substrate P is cut by the cutting blade 21 and the laser beam LB2, whereas the functional layer F is cut (divided) by the laser beam LB2, so that the substrate P and the functional layer F can be properly processed. Further, since the functional layer F can be uniformly cut, the quality of each device D can be made stable.

Conventionally, at least two laser processed grooves are formed along each division line L by applying a laser beam along both sides of each division line L to thereby divide the functional layer F. To the contrary, the first preferred embodiment of the present invention can eliminate the need for forming a plurality of laser processed grooves along each division line L to divide the functional layer F, so that the productivity can be improved.

Further, when the division of the functional layer F in forming the laser processed grooves along each division line L is insufficient, the cutting blade 21 may be deviated or tilted or uneven wearing of the cutting blade 21 may occur. To the contrary, the functional layer F is divided by the laser beam LB2 in the first preferred embodiment of the present invention, thereby eliminating the deviation or tilt of the cutting blade 21 or the uneven wearing of the cutting blade 21.

Further, the laser beam LB2 is applied to the wafer W from the back side WR thereof rather than from the front side WS of the wafer W. Accordingly, there is no possibility that debris may stick to the front side WS of the wafer W, so that it is unnecessary to form a protective film on the front side WS of the wafer W. Further, since the laser beam LB2 is applied along the bottom of each cut groove Pd, the energy of the laser beam LB2 applied is small and no thermal strain remains in the wafer W, so that the die strength of each device D is not reduced.

Further, at least two laser processed grooves are conventionally formed along each division line L to divide the functional layer F along both sides of each division line L. To the contrary, according to the first preferred embodiment of the present invention, the cut groove Pd is formed on the back side of the substrate P along each division line L. Accordingly, it is unnecessary to increase the width of each division line L, so that the number of devices D that can be formed on the wafer W can be increased. Further, since the laser beam LB2 is not applied from the front side WS of the wafer W, there is no possibility that the laser beam LB2 may pass through the passivation film to process the functional layer F and the heat generated in the functional layer F may be temporarily confined by the passivation film to cause the delamination of the functional layer in each device D.

Second Preferred Embodiment

Figure 19:
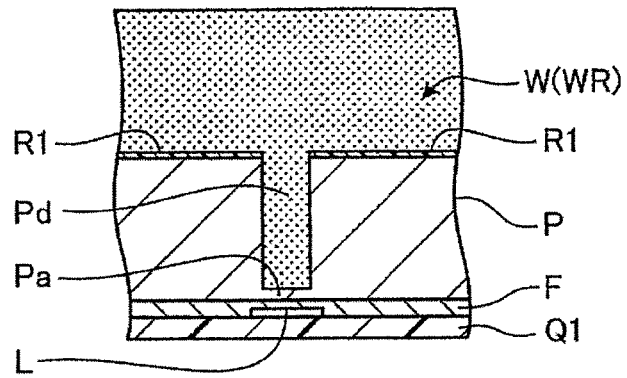
FIGS. 19 and 20 are sectional views showing a dividing step of dividing the wafer by plasma etching according to a second preferred embodiment of the present invention.
Figure 20:
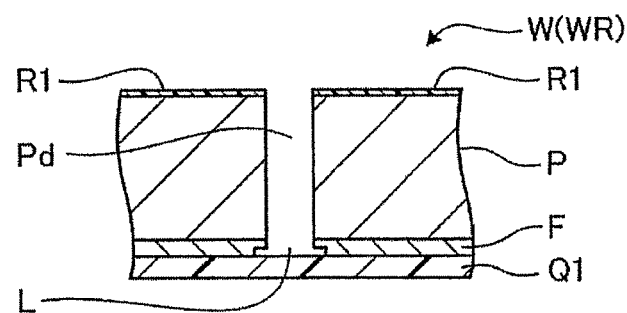

A second preferred embodiment of the wafer processing method according to the present invention will now be described. FIGS. 19 and 20 are sectional views showing a dividing step of dividing the wafer W by plasma etching according to the second preferred embodiment.

After forming the cut groove Pd on the back side WR of the wafer W along each division line L of the wafer W, a resist film R1 is formed on the back side WR of the wafer W in the area except each remaining part Pa as shown in FIG. 19. More specifically, the material of the resist film R1 is first applied to the whole of the back side WR of the wafer W, and next exposed to light through a predetermined mask pattern. Thereafter, the wafer W is immersed in a developer to thereby remove the resist film R1 from each remaining part Pa. Thus, the resist film R1 is formed on the back side WR of the wafer W in the area except each remaining part Pa. After forming the resist film R1 as mentioned above, the wafer W is subjected to plasma etching in a plasma chamber, thereby removing the remaining part Pa and the functional layer F along each division line L (see FIG. 20). In this manner, the remaining part Pa and the functional layer F along each division line L may be removed by plasma etching rather than by using the laser processing apparatus 200 in the dividing step. As a modification, the material of the resist film R1 may be applied to the whole of the back side WR of the wafer W before performing the cut groove forming step. In this case, the resist film R1 is removed along each division line L by performing the cut groove forming step.

Third Preferred Embodiment

Figure 21:
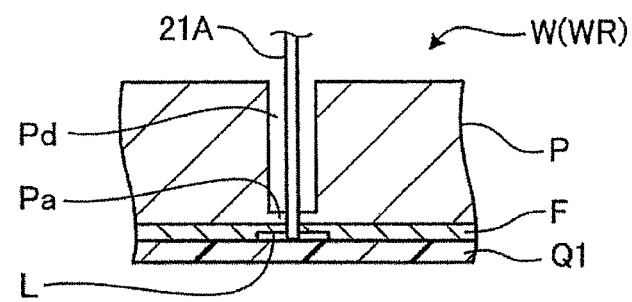
FIGS. 21 and 22 are sectional views showing a dividing step of dividing the wafer by using a cutting blade according to a third preferred embodiment of the present invention.
Figure 22:
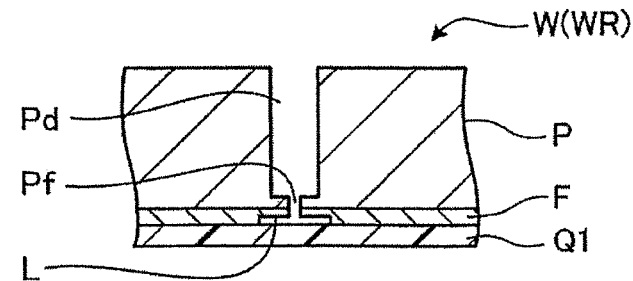

A third preferred embodiment of the wafer processing method according to the present invention will now be described. FIGS. 21 and 22 are sectional views showing a dividing step of dividing the wafer W by using a cutting blade according to the third preferred embodiment.

After forming the cut groove Pd on the back side WR of the wafer W along each division line L of the wafer W, a cutting blade 21A having a thickness smaller than that of the cutting blade 21 is used to cut the remaining part Pa and the functional layer F along each division line from the back side WR of the wafer W, thereby forming a division groove Pf along each division line L as shown in FIGS. 21 and 22. In this manner, the remaining part Pa and the functional layer F along each division line L may be cut by using the cutting blade 21A rather than by using the laser processing apparatus 200 in the dividing step.

Fourth Preferred Embodiment

Figure 23:
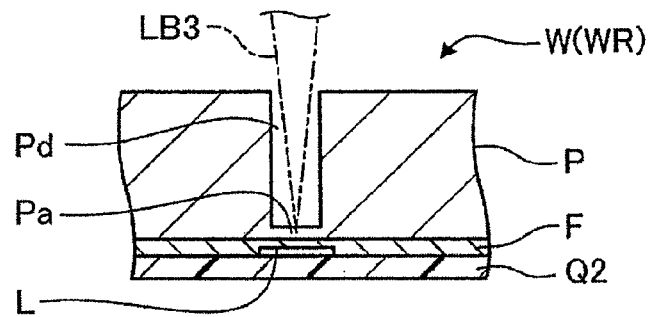
FIGS. 23 to 25 are sectional views showing a dividing step of dividing the wafer by forming a modified layer according to a fourth preferred embodiment of the present invention.
Figure 24:
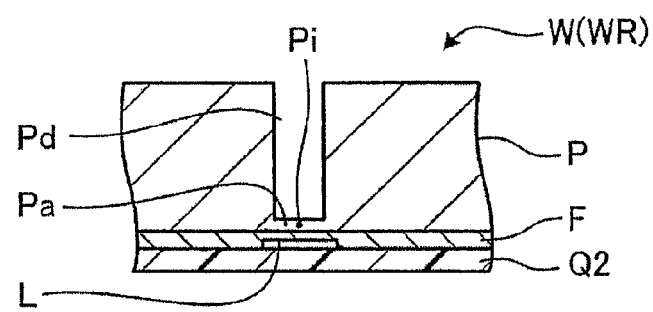
Figure 25:
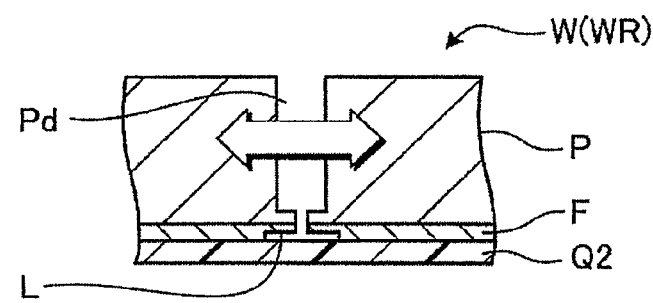

A fourth preferred embodiment of the wafer processing method according to the present invention will now be described. FIGS. 23 to 25 are sectional views showing a dividing step of dividing the wafer W by forming a modified layer according to the fourth preferred embodiment.

After forming the cut groove Pd on the back side WR of the wafer W along each division line L of the wafer W, laser beam applying means (not shown) is used to apply a laser beam LB3 from the back side WR of the wafer W to the remaining part Pa along each division line L, thereby forming a modified layer Pi inside the remaining part Pa as shown in FIGS. 23 and 24. Thereafter, an external force is applied to the wafer W by tape expansion or the like, thereby breaking the remaining part Pa and the functional layer F along each division line L as shown in FIG. 25. The laser beam LB3 has a transmission wavelength to the substrate P, and the focal point of the laser beam LB3 is set near the center of the thickness of the remaining part Pa in forming the modified layer Pi. As shown in FIG. 23, a protective member Q2 as an expanding tape having stretchability is attached to the front side of the functional layer F in place of the protective member Q1. In this manner, the modified layer Pi may be formed inside the remaining part Pa along each division line L by using the laser beam LB3 rather than by ablation using the laser processing apparatus 200 in the dividing step. Thereafter, the remaining part Pa and the functional layer F along each division line L may be broken from this modified layer Pi to thereby divide the wafer W.

Fifth Preferred Embodiment

Figure 26:
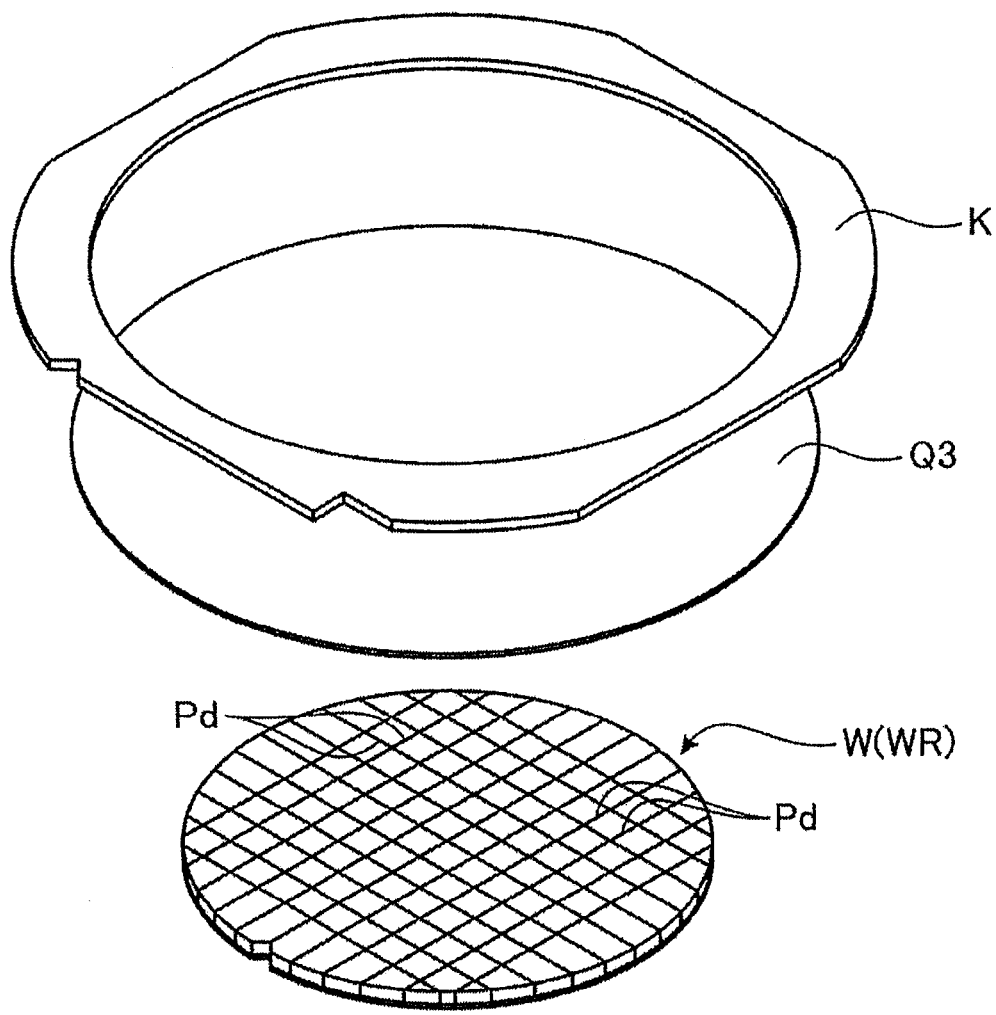
FIGS. 26 and 27 are perspective views showing an attaching step of attaching a protective tape according to a fifth preferred embodiment of the present invention.
Figure 27:
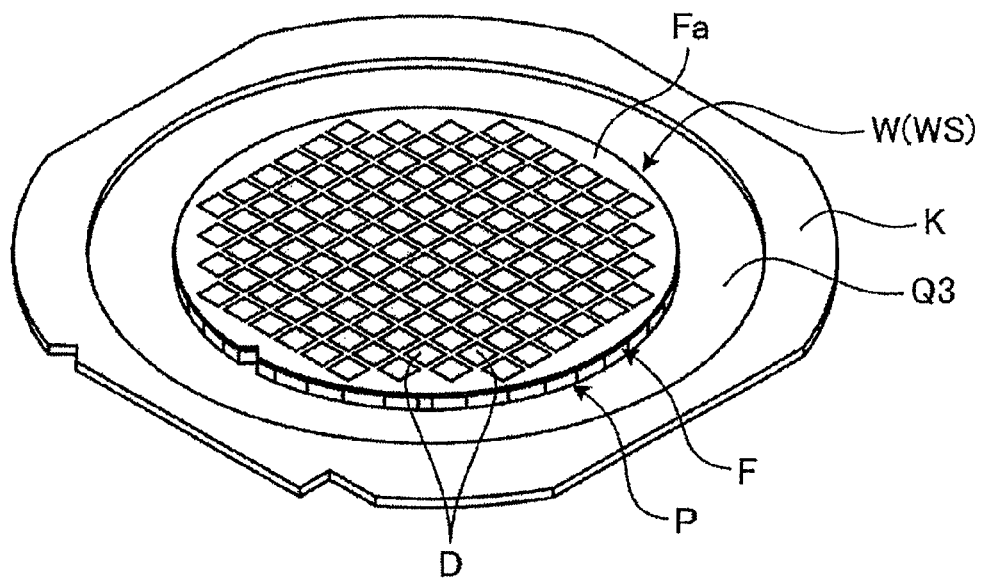
Figure 28:
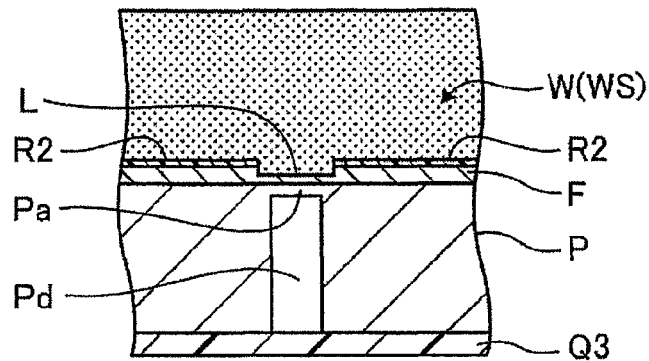
FIGS. 28 and 29 are sectional views showing a dividing step of dividing the wafer by plasma etching according to the fifth preferred embodiment.
Figure 29:
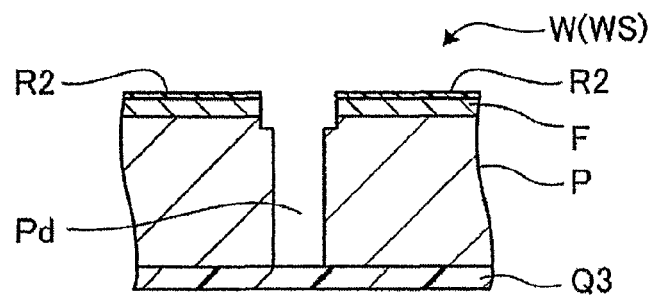

A fifth preferred embodiment of the wafer processing method according to the present invention will now be described. FIGS. 26 and 27 are perspective views showing an attaching step of attaching a protective tape according to the fifth preferred embodiment. FIGS. 28 and 29 are sectional views showing a dividing step of dividing the wafer W by plasma etching according to the fifth preferred embodiment.

After forming the cut groove Pd on the back side WR of the wafer W along each division line L of the wafer W, the protective member Q1 is first peeled from the front side WS of the wafer W. Thereafter, a protective tape Q3 is attached to the back side WR of the wafer W, and an annular frame K is also attached to the protective tape Q3 as shown in FIGS. 26 and 27. Thus, the wafer W is fixed through the protective tape Q3 to the annular frame K. Thereafter, a resist film R2 is formed on the front side WS of the wafer W in the area except each division line L as shown in FIG. 28. More specifically, the material of the resist film R2 is first applied to the whole of the front side WS of the wafer W, and next exposed to light through a predetermined mask pattern. Thereafter, the wafer W is immersed in a developer to thereby remove the resist film R2 from each division line L. Thus, the resist film R2 is formed on the front side WS of the wafer W in the area except each division line L. After forming the resist film R2 as mentioned above, the wafer W is subjected to plasma etching in a plasma chamber, thereby removing the functional layer F and the remaining part Pa along each division line L (see FIG. 29). In this manner, the functional layer F and the remaining part Pa along each division line L may be removed by plasma etching from the front side WS of the wafer W in the dividing step.

Sixth Preferred Embodiment

Figure 30:
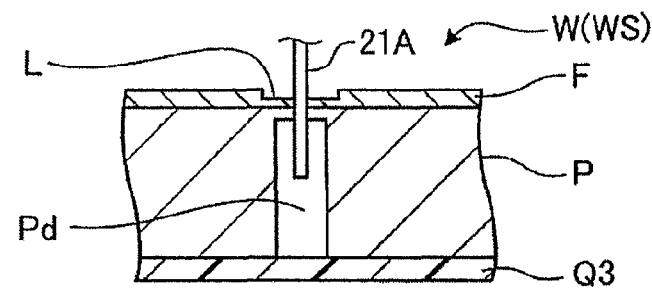
FIGS. 30 and 31 are sectional views showing a dividing step of dividing the wafer by using a cutting blade according to a sixth preferred embodiment of the present invention.
Figure 31:
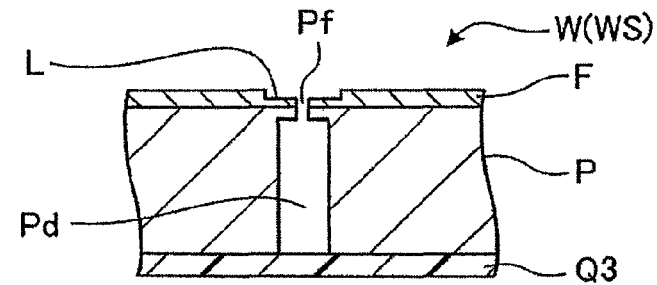

A sixth preferred embodiment of the wafer processing method according to the present invention will now be described. FIGS. 30 and 31 are sectional views showing a dividing step of dividing the wafer W by using a cutting blade according to the sixth preferred embodiment.

After attaching a protective tape Q3 to the back side WR of the wafer W in a manner similar to that of the fifth preferred embodiment mentioned above, a cutting blade 21A having a thickness smaller than that of the cutting blade 21 is used to cut the functional layer F and the remaining part Pa along each division line L from the front side WS of the wafer W, thereby forming a division groove Pf along each division line L as shown in FIGS. 30 and 31. In this manner, the functional layer F and the remaining part Pa along each division line L may be cut by using the cutting blade 21A from the front side WS of the wafer W in the dividing step.

Seventh Preferred Embodiment

Figure 32:
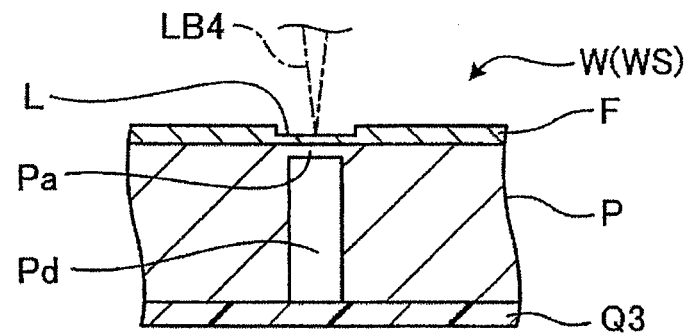
FIGS. 32 and 33 are sectional views showing a dividing step of dividing the wafer by ablation according to a seventh preferred embodiment of the present invention.
Figure 33:
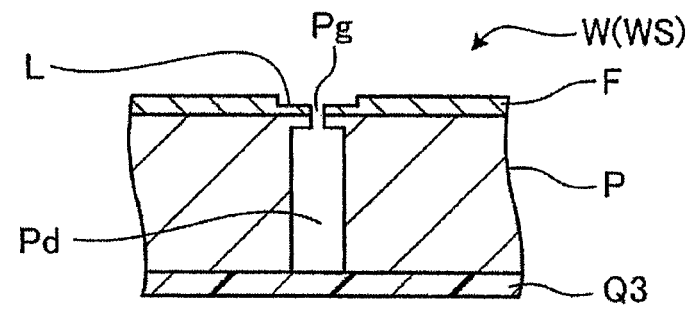

A seventh preferred embodiment of the wafer processing method according to the present invention will now be described. FIGS. 32 and 33 are sectional views showing a dividing step of dividing the wafer W by ablation according to the seventh preferred embodiment.

After attaching a protective tape Q3 to the back side WR of the wafer W in a manner similar to that of the fifth preferred embodiment mentioned above, laser beam applying means (not shown) is used to apply a laser beam LB4 from the front side WS of the wafer W to the functional layer F along each division line L, thereby forming a division groove Pg dividing the functional layer F and the remaining part Pa along each division line L as shown in FIGS. 32 and 33 (ablation processing). The laser beam LB4 has an absorption wavelength to the functional layer F and the substrate P, and the focal point of the laser beam LB4 is set on the upper surface of the functional layer F along each division line L in performing the ablation processing. In this manner, the ablation processing may be performed from the front side WS of the wafer W to cut the functional layer F and the remaining part Pa along each division line L, thereby dividing the wafer W.

Eighth Preferred Embodiment

Figure 34:
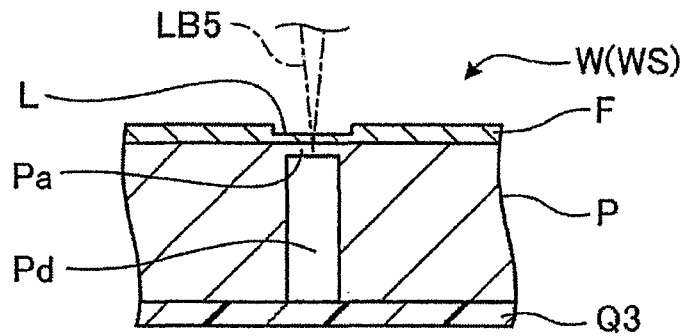
FIGS. 34 to 36 are sectional views showing a dividing step of dividing the wafer by forming a modified layer according to an eighth preferred embodiment of the present invention.
Figure 35:
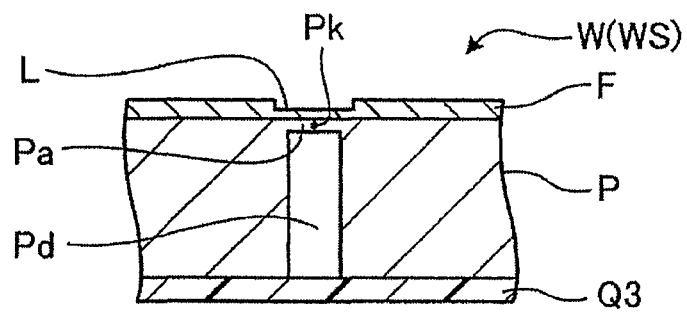
Figure 36:
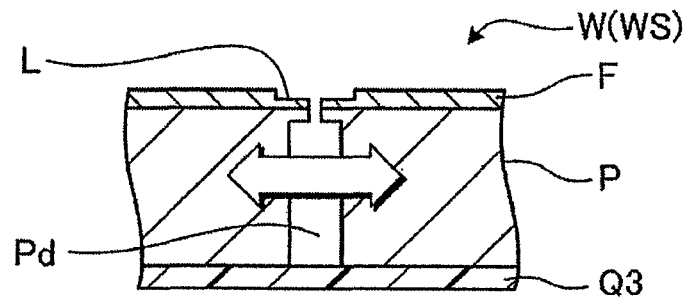

An eighth preferred embodiment of the wafer processing method according to the present invention will now be described. FIGS. 34 to 36 are sectional views showing a dividing step of dividing the wafer W by forming a modified layer according to the eighth preferred embodiment.

After attaching a protective tape Q3 to the back side WR of the wafer W in a manner similar to that of the fifth preferred embodiment mentioned above, laser beam applying means (not shown) is used to apply a laser beam LB5 from the front side WS of the wafer W to the remaining part Pa along each division line L, thereby forming a modified layer Pk inside the remaining part Pa as shown in FIGS. 34 and 35. Thereafter, an external force is applied to the wafer W by tape expansion or the like, thereby breaking the functional layer F and the remaining part Pa along each division line L as shown in FIG. 36. The laser beam LB5 has a transmission wavelength to the functional layer F and the substrate P, and the focal point of the laser beam LB5 is set near the center of the thickness of the remaining part Pa in forming the modified layer Pk. The protective tape Q3 attached to the back side WR of the wafer W is an expanding tape having stretchability. In this manner, the laser beam LB5 may be applied from the front side WS of the wafer W to thereby form the modified layer Pk inside the remaining part Pa along each division line L. Thereafter, the functional layer F and the remaining part Pa along each division line L may be broken from this modified layer Pk to thereby divide the wafer W.

Modifications

Modifications of the first to eighth preferred embodiments mentioned above will now be described. While the height H1 of the interface B between the functional layer F and the substrate P is determined with reference to the holding surface 11 of the chuck table 10 in the above preferred embodiments, the present invention is not limited to this configuration, but it is sufficient that the position of the cutting blade 21 can be defined with respect to the height of the interface B. For example, the height of the interface B may be determined with reference to the measurement position of the height measuring means 91.

Further, the functional layer F includes not only the low-k films, but also any other functional films such as passivation film, metal film, and optical device layer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of crossing division lines, said wafer being composed of a substrate and a functional layer formed on a front side of said substrate, said division lines being formed on a front side of said functional layer to thereby define a plurality of separate regions where said devices are respectively formed, said wafer processing method comprising:

a protective member attaching step of attaching a protective member to the front side of said functional layer of said wafer;

a height recording step of holding said wafer on a chuck table in a condition where said protective member is in contact with said chuck table after performing said protective member attaching step, applying a laser beam having a transmission wavelength to said substrate from a back side of said wafer held on said chuck table to detect the height of an interface between said functional layer and said substrate in a Z direction in an area corresponding to each division line as relatively moving said chuck table and said laser beam in an X direction, and recording an X coordinate on each division line and a Z coordinate corresponding to said X coordinate and said height detected;

a cut groove forming step of positioning a cutting blade on the back side of said substrate of said wafer in the area corresponding to each division line after performing said height recording step and next relatively moving said chuck table and said cutting blade in said X direction to thereby form a cut groove having a depth not reaching said functional layer with a remaining part of said substrate left between the bottom of said cut groove and said functional layer; and a dividing step of dividing said remaining part and said functional layer along said cut groove extending along each division line after performing said cut groove forming step;

said cut groove forming step including the step of moving said cutting blade in said Z direction according to said X coordinate and said Z coordinate recorded in said height recording step to thereby make the thickness of said remaining part uniform in said X direction.

2. The wafer processing method according to claim 1, wherein said height recording step is performed at the same X coordinate as the X coordinate where said cutting blade is to be positioned in said cut groove forming step.

3. The wafer processing method according to claim 1, wherein height measuring means is used in said height recording step to measure the height of said interface between said functional layer and said substrate by using reflected light obtained by the reflection of said laser beam from said interface.

* * * * *